United States Patent [19]

Beelitz et al.

[11] 4,127,820
[45] Nov. 28, 1978

[54] ELECTRICAL CIRCUIT FOR MULTIPLEXING AND DIVIDING DIFFERENT BANDS OR FREQUENCIES

[75] Inventors: Howard R. Beelitz, Princeton; Donald R. Preslar, Somerville, both of N.J.

[73] Assignee: RCA Corporation, New York, N.Y.

[21] Appl. No.: 781,878

[22] Filed: Mar. 28, 1977

[51] Int. Cl.² .............................................. H04B 1/16
[52] U.S. Cl. .................................. 325/459; 325/461; 307/243; 330/252
[58] Field of Search .............. 325/452, 453, 457–459, 325/464, 465, 468, 461; 328/133, 152, 154, 158; 307/243, 220 R, 355, 364; 330/69, 252, 257

[56] References Cited

U.S. PATENT DOCUMENTS

| | | | |
|---|---|---|---|
| 3,883,807 | 5/1975 | Alberkrack | 325/459 |
| 3,942,122 | 3/1976 | Nakanishi | 325/459 |
| 3,997,796 | 12/1976 | Sanders et al. | 307/220 R |
| 4,009,441 | 2/1977 | Kumagai et al. | 325/461 |
| 4,019,118 | 4/1977 | Harwood | 330/252 |
| 4,024,476 | 5/1977 | Briggs | 325/468 |
| 4,052,679 | 10/1977 | Hosoya | 330/252 |

*Primary Examiner*—Robert L. Griffin
*Assistant Examiner*—Jin F. Ng
*Attorney, Agent, or Firm*—H. Christoffersen; H. I. Schanzer

[57] ABSTRACT

The circuit includes a band selector which in one state controls the passage of a first band of frequencies (e.g. UHF signals) via a counter to a first input port of an Amplifier-Multiplexer (AMP/MUX) and which in another state controls the passage and amplification of a second band of frequencies (e.g. VHF signals) applied to a second input port of the AMP/MUX. When the band selector is in the one state, the stages of the counter are activated and only signals in the first band are coupled through the counter and through the AMP/MUX to additional count down stages connected to the output(s) of the AMP/MUX. In the other state, the stages of the counter are inactivated to prevent oscillations and feed through, and only signals in the second band are coupled through the AMP/MUX to the additional countdown stages.

8 Claims, 4 Drawing Figures

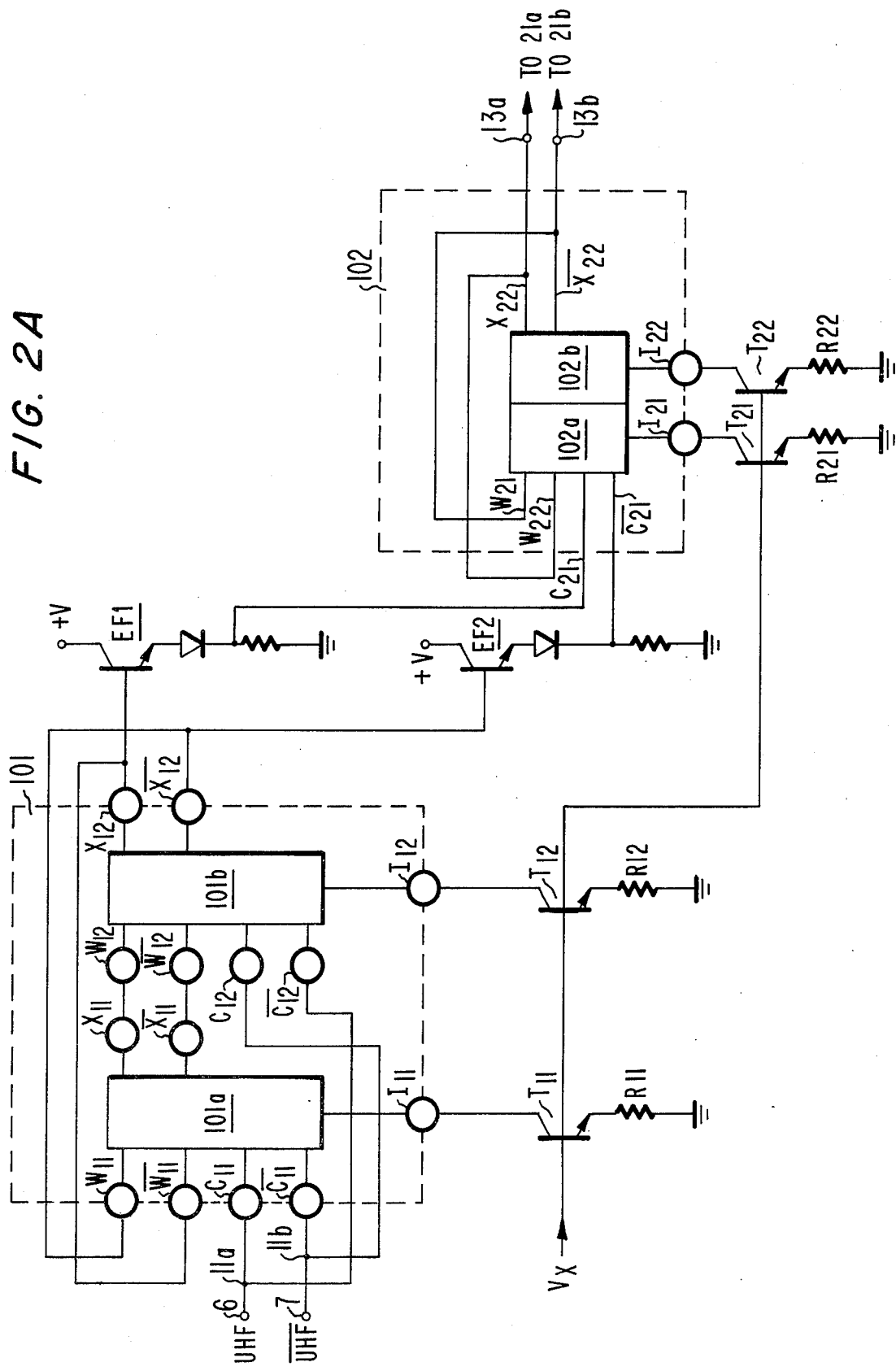

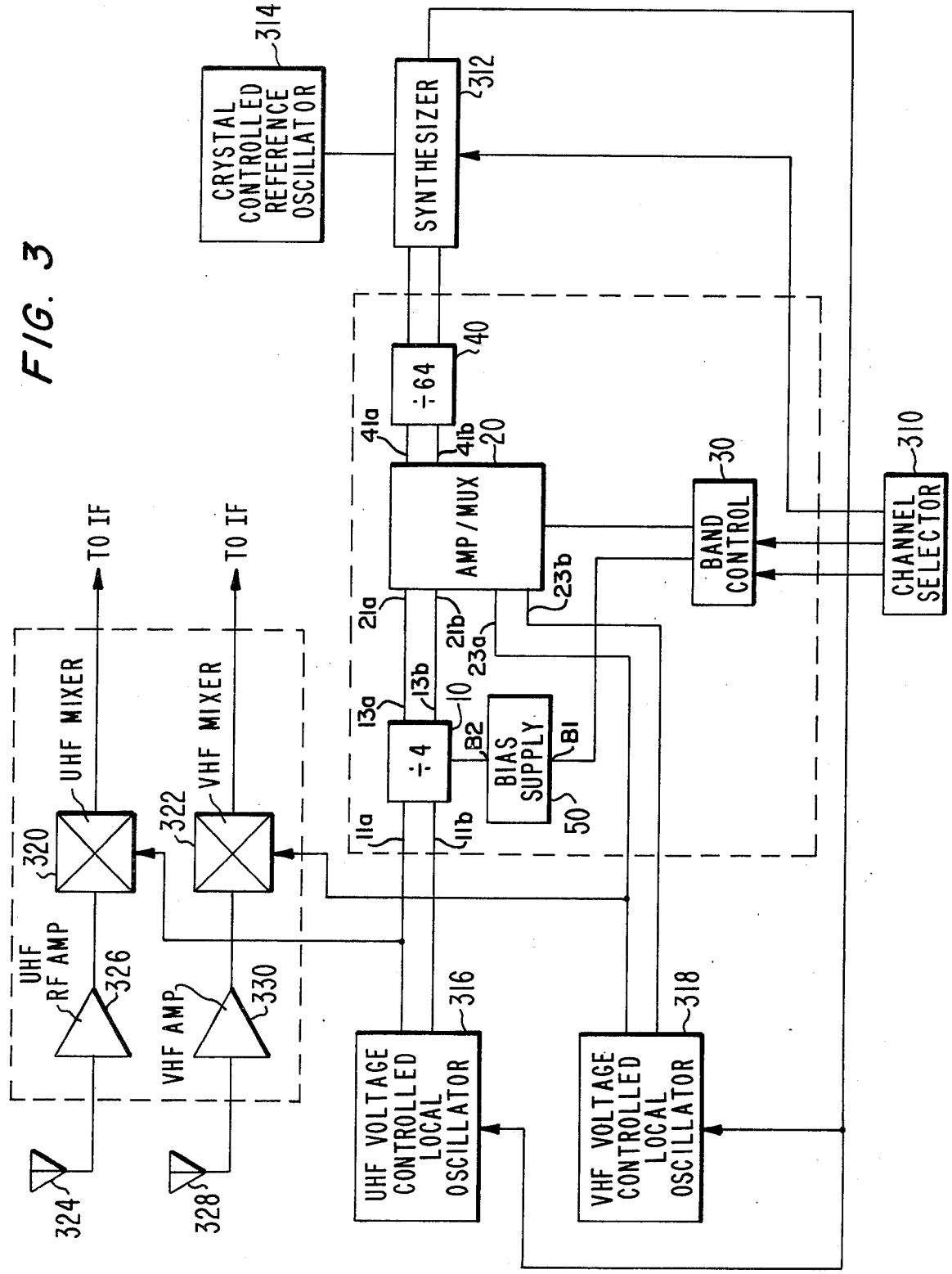

ELECTRICAL CIRCUIT FOR MULTIPLEXING AND DIVIDING DIFFERENT BANDS OR FREQUENCIES

This invention relates to apparatus for selecting, scaling and multiplexing different frequencies. The apparatus is useful, among others, in frequency synthesis applications, e.g. TV tuning systems, general instrumentation, and communication systems.

Many systems are adapted to receive a plurality of different frequencies with selection means available for processing one of these frequencies at a time. For example, TV systems are adapted to receive two different bands (e.g. UHF and VHF) of frequencies, where the frequency range of one of the bands (e.g. UHF) is approximately four times that of the other band (e.g. VHF). In various portions of the TV tuning system, these frequencies have to be scaled down and many stages of division are required. For purposes of economy of parts, decreased cost of fabrication, and increased reliability, it is desirable that, where possible, the different bands share the same count down circuit. For the example above, this may be achieved by first dividing the UHF band by a factor of four and then using the same count down circuitry for the UHF and VHF signals. However, it is also essential that the different bands be isolated from each other to prevent noise and cross talk between the bands.

Circuits embodying the invention include means for applying a first signal of first frequency to a counter whose output is coupled to a first input port of an amplifying means. A second signal of second frequency is coupled to a second input port of the amplifying means. The amplifying means has an output port and settable control means which when set to a first condition causes the signals produced at the output of the amplifying means to be responsive only to the signals at the first port and which when set to a second condition causes the signals produced at the output of the amplifying means to be responsive only to the signals at the second port. A frequency selector having first and second states is coupled to the counter and to the control means. The selector enables the counter and sets the control means to its first condition when in the first state. The selector sets the control means to the second condition and disables the counter when in the second state, whereby the first signal is not fed through the counter to the first port.

In the accompanying drawings like reference characters denote like components; and FIG. 1 is a schematic diagram of a circuit embodying the invention;

FIGS. 2A and 2B are detailed diagrams of the counter 10 shown in FIG. 1; and

FIG. 3 is a block diagram of a TV system employing the invention.

Figure 1:
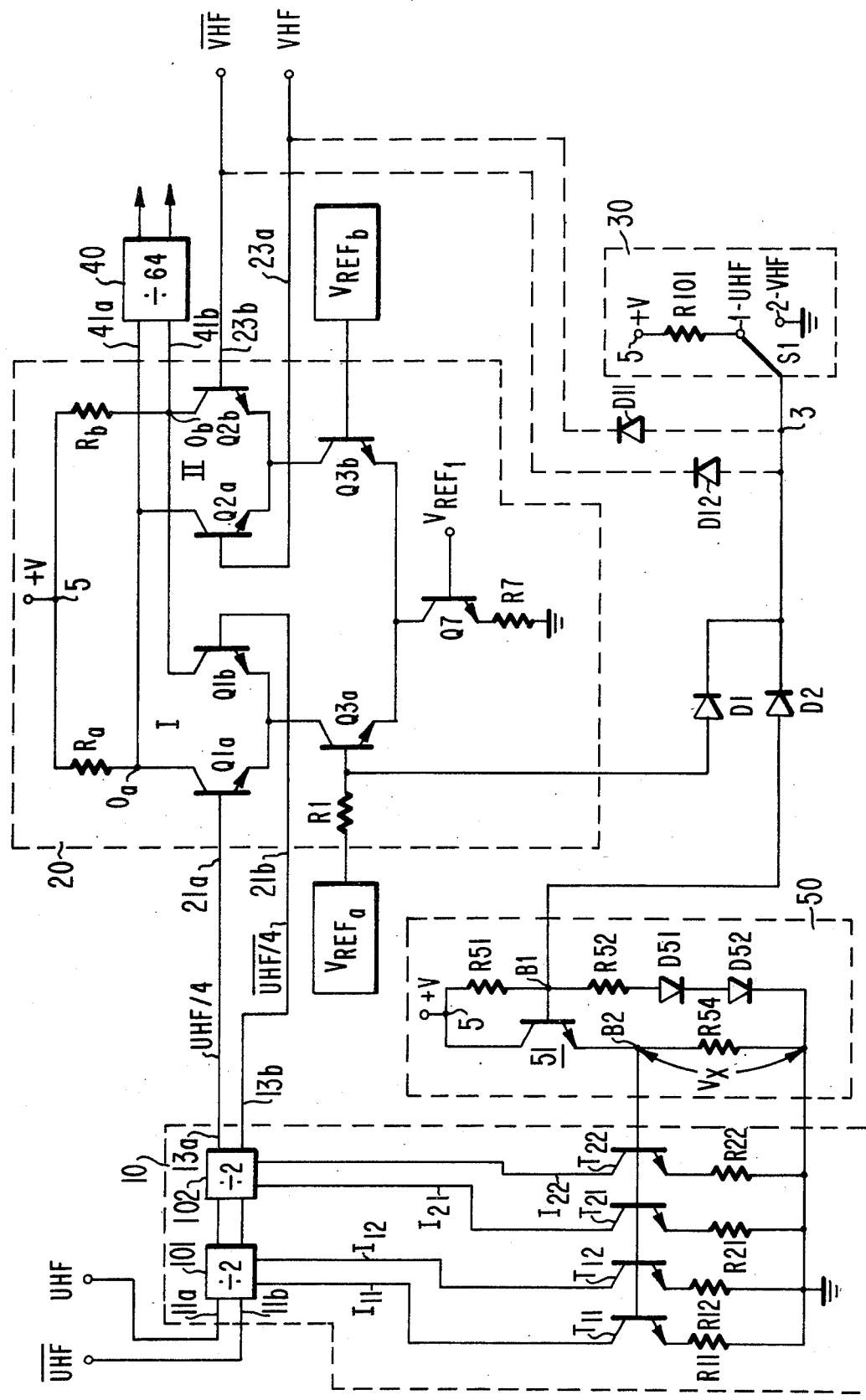

In the system of FIG. 1, a UHF signal and its complement, $\overline{\text{UHF}}$, are applied to input terminals 11a and 11b, respectively, of a divide-by-4 counter 10. Counter 10 has two outputs 13a and 13b connected to inputs 21a and 21b, respectively, of an Amplifier-Multiplexer (AMP/MUX) 20. Counter 10, as detailed below, has current input nodes (I11, I12, I21, I22) to which are connected the collectors of current source transistors (T11, T12, T21, T22). The emitters of the current source transistors are returned via resistors (R11, R12, R21, and R22) to ground potential. A bias potential $V_X$ generated by a bias source 50 is applied to the bases of the current source transistors.

Bias source 50 includes a resistor R51 connected between +V volts (terminal 5) and a node B1 and a resistor R52 connected in series with diodes D51 and D52 between node B1 and ground. An emitter follower transistor 51 is connected at its collector to terminal 5, at its base to node B1, and at its emitter to node B2 at which is produced the bias voltage $V_X$. A resistor R54 is connected between node B2 and ground.

The potential $V_{B1}$ at node B1 is equal to the two forward voltage drops ($2 \cdot V_F$) of diodes D51 and D52 plus the potential drop ($V_{R52}$) across resistor R52, when switch S1 of band selector 30 is in position 1. Assuming the forward drop $V_F$ of a diode to be approximately equal to the base-to-emitter ($V_{BE}$) drop of a transistor, $V_{B1}$ is then equal to $2V_{BE} + V_{R52}$ and $V_X$ is equal to $V_{BE} + V_{R52}$. This value of $V_X$ defined as $V_{ON}$ turns on the current source transistors of counter 10 and enables counter 10. In response to the UHF and $\overline{\text{VHF}}$ at inputs 11a and 11b, complementary signals UHF/4 and $\overline{\text{UHF}}$/4 are produced at outputs 13a and 13b which have one fourth the frequency of the input signals.

When switch S1 is in position 2, $V_{B1}$ is at $V_{BE}$ volts and $V_X$ is then at, or close to, ground potential. Current source transistors, T11, T12, T21 and T22 are then turned off and, as detailed below, outputs 13a and 13b of counter 10 are driven to within $V_{BE}$ volts of +V volts.

A VHF signal and its complement, $\overline{\text{VHF}}$, are applied to inputs 23a and 23b, respectively, of AMP/MUX 20. The UHF/4 signals and the VHF signals applied to the two input ports (21a, 21b and 23a, 23b) of AMP/MUX 20 are approximately within the same frequency range since the signals in the UHF band which have a frequency of approximately four times those in the VHF band are divided down by four before being applied to AMP/MUX 20.

The AMP/MUX 20 includes first (I) and second (II) differential amplifiers. Differential amplifier I (DA-I) includes transistors Q1a and Q1b connected at their bases to inputs 21a and 21b, respectively and at their emitters to the collector of switching transistor Q3a. Differential amplifier II (DA-II) includes transistor Q2a and Q2b whose bases are connected to inputs 23a and 23b, respectively, and whose emitters are connected to the collector of switching transistor Q3b.

The collectors of transistors Q1a and Q2a are connected in common to output "a" ($O_a$) and the collectors of transistors Q1b and Q2b are connected in common to output "b" (O). Load resistors $R_a$ and $R_b$ are connected between outputs $O_a$ and $O_b$, respectively, and power terminal 5, to which is applied +V volts. The signals produced at $O_a$ and $O_b$ are applied to inputs 41a and 41b of divide-by-64 counter 40.

The emitters of transistors Q3a and Q3b are connected in common to the collector of a current source transistor Q7. The emitter of transistor Q7 is connected via an emitter resistor R7 to ground potential and a reference voltage $V_{REF1}$ is applied to its base to cause a relatively constant current to flow through its collector-to-emitter path.

A reference voltage $V_{REFa}$, which is more positive than $V_{RF1}$, is applied via resistor R1 to the base of transistor Q3a, and a reference voltage $V_{REFb}$, which is less positive than $V_{REFa}$ but more positive than $V_{REF1}$, is applied to the base of transistor Q3b.

When the potential ($V_{BQ3a}$) at the base of transistor Q3a is more positive than the potential ($V_{BQ3b}$) at the base of transistor Q3b, transistor Q3a is turned on and transistor Q3b is turned off. The current produced by transistor Q7 is then passed via the conduction path of transistor Q3a to the emitters of transistors Q1a, Q1b.

DA-I then produces output signals at $O_a$ and $O_b$ which are solely responsive to, and are an amplified version of, the UHF/4 and $\overline{UHF}$/4 signals applied to its inputs, 21a and 21b.

When $V_{BQ3a}$ is less positive than $V_{BQ3b}$, transistor Q3a is truned off and transistor Q3b is turned on, disabling DA-I and enabling DA-II. Transistor Q3b couples current source Q7 to the emitters of transistors Q2a, Q2b. DA-II then produces output signals at $O_a$ and $O_b$ which are solely responsive to, and are an amplified version of, the VHF signals applied to its inputs 23a, 23b.

The signals (UHF/4 and VHF) applied to AMP/MUX 20 are multiplexed in that only one of DA-I and DA-II is enabled at a time and when DA-I is enabled it produces outputs at $O_a$ and $O_b$ responsive to its inputs and when DA-II is enabled it produces outputs responsive to its inputs.

Band selector 30 controls the turn on and turn off of counter 10 and determines whether DA-I or DA-II is turned on. Band selector 30 includes switch S1 which is shown, for ease of illustration, as a two position (1-UHF and 2-VHF) switch, but which may be any device capable of producing two different voltage levels.

The wiper arm 3 of switch S1 is connected to the cathodes of diodes D1 and D2 and to the anodes of diodes D11, D12. The anode of diode D1 is connected to the base of transistor Q3a and the anode of diode D2 is connected to node B1. Terminal 1 of switch S1 is returned via a resistor R101 to +V volts and terminal 2 is grounded.

When switch S1 is in position 1-UHF, the wiper arm 3 goes to +V volts and diodes D1 and D2 are reverse biased and non-conducting (except for small leakage currents). Bias source 50 is then decoupled from switch S1 and produces a potential $V_X = V_{ON}$ at its output which enables counter 10. Concurrently, since $V_{REFa}$ is more positive than $V_{REFb}$, DA-I is enabled (DA-II is disabled) whereby the UHF signals are divided down by a factor of 4 and only the UHF signals are amplified and passed by AMP/MUX 20 to outputs $O_a$ and $O_b$.

Diodes D11 and D12, are connected at their cathodes to inputs 23a and 23b, respectively and at their anodes wiper arm 3 of switch S. Diodes D11 and D12 bias the bases of transistors Q2a and Q2b to +V volts less the $V_F$ of the diodes, when S1 is in position 1. This prevents noise signals from being coupled via the base-to-collector capacitances of transistors Q2a and Q2b onto the output lines of AMP/MUX 20. These diodes are shown in phantom view to indicate that they are not necessary to the operation of the circuit and may be either omitted, or replaced by other devices performing a like function.

When switch S1 is set to position 2-VHF, the wiper arm 3 is returned to ground potential. This grounds the cathodes of diodes D1 and D2 and the anodes of diodes D11 and D12. Grounding the cathodes of diodes D1 and D2 causes: (a) $V_{BQ3a}$ to decrease below $V_{REFb}$ which turns off transistor Q3a and turns on transistor Q3b. This disables DA-I and enables DA-II; and (b) $V_{B1}$ is lowered to one diode drop ($V_{BE}$ volts) above ground potential causing $V_X$ to be at, or close to, ground potential, and counter 10 to be disabled. Consequently, only the VHF signals are amplified and passed by AMP/MUX 20 to outputs $O_a$ and $O_b$.

It is important to turn off counter 10 when processing VHF signals to reduce noise and cross talk. Recall that when switch S1 is in position 2-VHF, transistor Q3a is turned off and hence transistors Q1a and Q1b of DA-1 are non-conducting. Therefore, these transistors are not capable of amplifying the signals applied to terminals 21a, 21b and it would seem to be unnecessary to turn off counter 10.

However, there exists capacitance ($C_{BC}$) between the base and collector of transistors Q1a and Q1b, and any change in potential (be it due to noise or signal) on lines 21a and 21b is coupled (although highly attenuated) via the $C_{BC}$ of Q1a and Q1b onto outputs $O_a$ and $O_b$. Disabling counter 10 prevents any UHF signal from being coupled to output 13a and 13b and hence to the bases of transistors Q1a, Q1b. In addition, when counter 10 and DA-I are disabled, the bases of transistors Q1a and Q1b are driven to a fixed potential (+V − $V_{BE}$ volts). Holding these points (13a, 13b, 21a, 21b) at a fixed potential with low impedance sources, as further described below, substantially reduces the possibility of coupling unwanted signals from lines 21a and 21b through unselected amplifier DA-I to the outputs of AMP/MUX 20.

Although the system is described with the inputs of the AMP/MUX clamped to a fixed potential, close to +V volts, the inputs 21a and 21b could alternatively be clamped to ground.

For like reasons to the ones discussed above, diodes D11 and D12, or an equivalent means, are used to clamp the VHF inputs when switch S1 is in position 1-UHF. This substantially reduces any interference at the output of the AMP/MUX from the unselected VHF differential amplifier stage.

When counter 10 and DA-I are disabled, the bases of transistors Q1a and Q1b are at +V − $V_{BE}$ volts. The potential at their collectors is then set by DA-II. But, DA-II is designed such that the outputs $O_a$ and $O_b$ do not go below (+V − $V_{BE}$ volts). Therefore, the collector-to-base diodes of transistors Q1a and Q1b are never forward biased when DA-I is disabled and DA-II is turned on. Similar consideration applies when DA-I is enabled and DA-II is disabled.

In the circuit of FIG. 1 double ended operation is illustrated. That is, complementary signals (VHF, $\overline{VHF}$ and UHF, $\overline{UHF}$) are applied to the inputs (11a, 11b and 23a, 23b). However, single ended operation is equally possible. That is, a signal (VHF or UHF) can be applied to one input of a pair of inputs with the other input of the pair held at a fixed potential. Also, although two differential outputs ($O_a$, $O_b$) are produced by AMP/MUX 20, it is possible to produce and use but a single output from the AMP/MUX.

Although many different counter circuits may be used to practice the invention, a particularly useful high frequency counter is shown in FIG. 2.

Figure 2B:
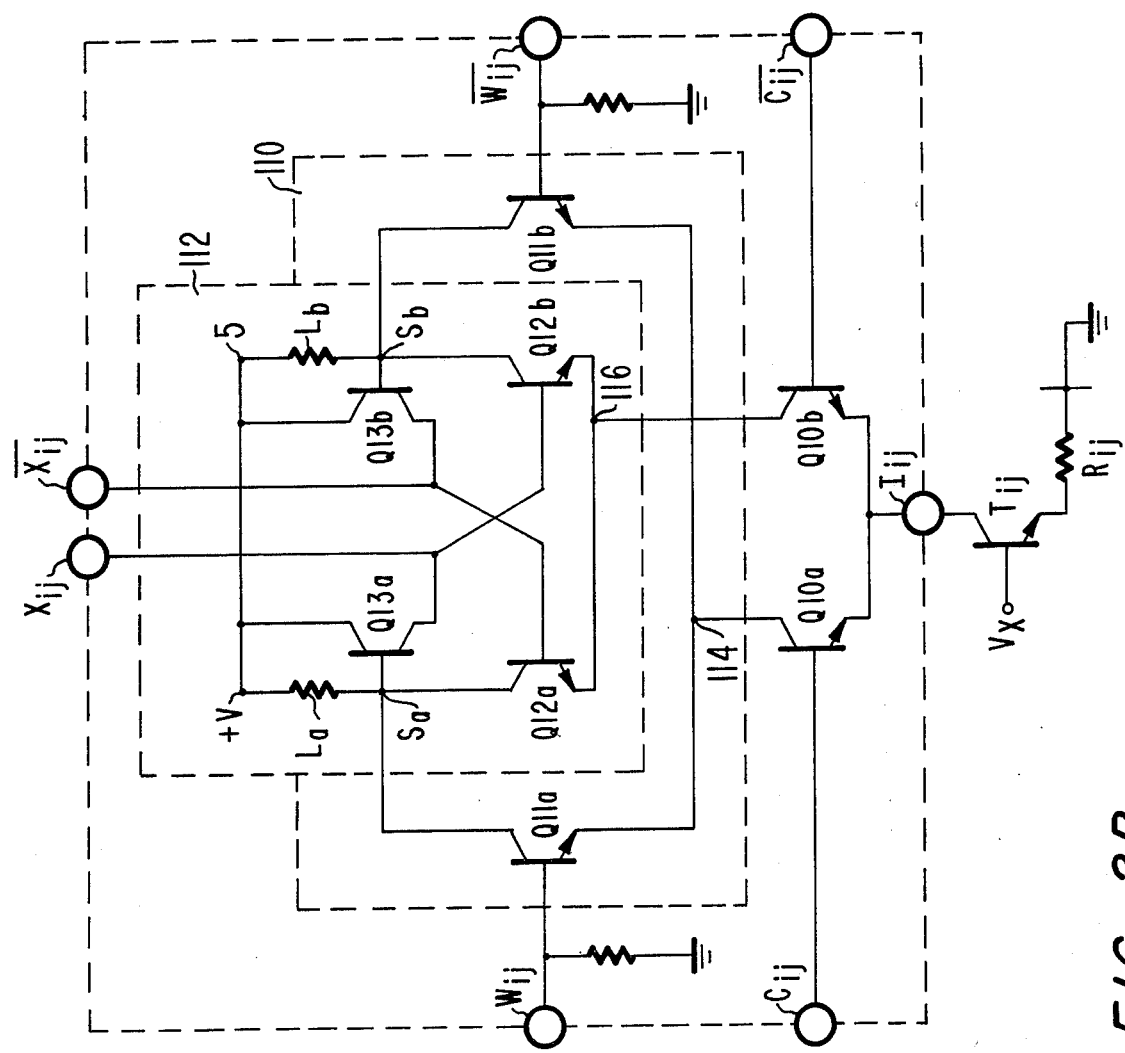

Counter 10 includes two count-of-2 stages 101, 102, as shown in FIG. 2A. Each stage, in turn, includes two half stages, 101a and 101b, 102a and 102b, of the type shown in FIG. 2B.

Each half stage includes an emitter-coupled differential gate 110 (Q11a and Q11b) and an emitter-coupled set-reset flip-flop 112 (Q12a, Q12b, Q13a and Q13b). Each half stage has two control inputs $C_{ij}$ and $\overline{C_{ij}}$ which determine whether the gate 110 or the flip flop 112 is turned on; two signal input terminals $W_{ij}$ and $\overline{W_{ij}}$, two signal output terminals $X_{ij}$ and $\overline{X_{ij}}$ and a current input point $I_{ij}$.

The signals at terminals C, $\overline{C}$, W, $\overline{W}$, X and $\overline{X}$ are referred to as being high or low. The terms "high" and "low" as used herein are relative terms; the more positive of two signals is defined as being "high" and the more negative is defined as being "low".

Gate 110 includes a pair of transistors Q11a, Q11b whose bases are connected to terminals W and $\overline{W}$, respectively, whose collectors are connected to output nodes $S_a$ and $S_b$, respectively, and whose emitters are connected to current node 114. Load resistors $L_a$ and $L_b$ are connected between nodes $S_a$ and $S_b$, respectively and terminal 5.

Transistors Q10a and Q10b whose bases are connected to terminals $C_{ij}$ and $\overline{C_{in}}$, respectively, determine which one of the gate 110 and the flip flop 112 in enabled at any one time. The collector-to-emitter path of transistor Q10a is connected between node 114 and current source $T_{ij}$ and the collector-to-emitter path of transistor Q10b is connected between node 116 and current source $T_{ij}$.

When transistor Q10a is turned on, gate 110 is enabled. Transistors Q11a and Q11b then function as a differential amplifier or a current mode switch whose output sets the flip flop 112. When Q10a is on, and inputs W and $\overline{W}$ are high and low, respectively, the outputs $S_a$ and $X_{ij}$ go low and the outputs $S_b$ and $\overline{X_{ij}}$ go high. On the other hand, for Q10a on and W low and $\overline{W}$ high, the outputs $S_a$ and $X_{ij}$ go high and the outputs $S_b$ and $\overline{X_{ij}}$ go low.

The signals generated at $S_a$ and $S_b$ are stored in flip flop 112 which includes transistors Q12a and Q12b cross coupled by means of emitter follower transistors Q13a and Q13b which also function to level shift the signals at nodes $S_a$ and $S_b$ to output terminals $X_{ij}$ and $\overline{X_{ij}}$, respectively. Transistors Q12a and Q12b are connected at their collectors to nodes $S_a$ and $S_b$ respectively, at their bases to terminals $\overline{X_{ij}}$ and $X_{ij}$, respectively, and at their emitters to current node 116. Transistor Q13a is connected at its base to node $S_a$, at its emitter to terminal $X_{ij}$ and at its collector to terminal 5. Transistor Q13b is connected at its base to node $S_b$, at its emitter to terminal $\overline{X_{ij}}$ and at its collector to terminal 5.

The counter stages are enabled when $V_X$ applied to the base of the current source transistor $T_{ij}$ has a value $V_{ON}$. As long as $V_X$ is equal to (or greater) than $V_{On}$ the counter stages are turned on. Interconnected as shown in FIG. 2A, each counter stages produces at its output $X_{i2}$, $\overline{X_{i2}}$ a signal whose frequency is one half the frequency of the signals at its inputs $C_{i1}$, $\overline{C_{i1}}$. Furthermore, the outputs of the first stage are level shifted by emitter followers EF1 and EF2 and are then applied to the inputs of the second stage.

When $V_X$ is equal to or less than $V_{BE}$ volts, transistor $T_{ij}$ is turned off. The counter stage is then disabled, and no current flows through transistors Q11a, Q11b, Q12a, Q12b, Q10a and Q10b. However, transistors Q13a and Q13b still function as emitter followers and drive their associated output terminals ($X_{ij}$, $\overline{X_{ij}}$) to approximately one $V_{BE}$ drop ($\approx$ 0.8 volts) below +V volts. Since transistors Q13a and Q13b function as emitter followers, they have a low output impedance. They are, therefore, capable of holding lines $X_{ij}$ and $\overline{X_{ij}}$ at the fixed levels and noise signals must have considerable energy to cause a change in the voltage on these lines.

FIG. 3 illustrates the use of the circuit of the invention in a TV system.

A channel selector 310 controls the state of band selector 30 and a synthesizer circuit 312 which includes digital divider circuitry, and phase comparison circuitry for comparing the frequency of a reference crystal controlled oscillator 314 with the signals derived from the output of divide-by-64 counter 40.

An output of synthesizer circuit 312 controls the frequency of oscillation of the UHF voltage controlled oscillator (VCO) 316 and the VHF VCO 318. The output(s) of UHF VCO 316 are applied to inputs 11a and 11b of $\div$ 4 counter 10 and to a UHF mixer 320. The outputs of the VHF VCO 318 are applied to inputs 23a and 23b of AMP/MUX 20 and to a VHF mixer 322. The UHF signals are received by an antenna 324 which is coupled to RF amplifier 326 whose output is applied to UHF mixer 320. The VHF signals are received by antenna 328 which is coupled to amplifier 330 whose output is applied to VHF mixer 322.

When the channel selector 310 is made to select any frequency in the UHF band, selector 30 is set to a position which enables the system to process only the UHF signal. When the channel selector 310 is made to select any frequency in the VHF band, selector 30 is set to a position which enables the system to process only the VHF signals.

What is claimed is:

1. The combination comprising:
   a first input terminal adapted to receive signals in a first frequency range,
   a second input terminal adapted to receive signals in a second frequency range, different from said first frequency range;
   a divide-by-N counter having an input coupled to said first input terminal and having an output at which are produced signals having a frequency of 1/N the frequency of its input signals; said counter having a bias input point for controlling its turn on and turn off;
   an amplifying means having a first input coupled to said counter output and a second input coupled to said second input terminal; said amplifying means having an output terminal and also having a control means settable to a first condition for enabling the production at said output terminal of signals responsive only to the signals at said first input terminal; and settable to a second condition for enabling the production at said output terminal of signals responsive only to the signals at said second input terminal; and
   frequency selector means coupled to said bias input point and to said control means for selectively turning on said counter and setting said control means to said first condition and for selectively turning off said counter and setting said control means to said second condition.

2. The combination as claimed in claim 1 wherein said first and second frequencies lie in first and second bands of frequencies, respectively, where the range of the first band is approximately N times the range of the second band.

3. The combination as claimed in claim 2 wherein N is equal to four, wherein said first band of frequencies corresponds to the UHF band and wherein said second band of frequencies corresponds to the VHF band.

4. The combination as claimed in claim 1, wherein said amplifying means includes first and second differential amplifiers, each amplifier having first and second differential inputs, first and second differential outputs, and a current input node;
  wherein the first outputs of the differential stages are connected in common and wherein the second outputs of the differential stages are connected in common;
  wherein said control means includes a first current switch connected between said current input node of said first differential amplifier and a current source and a second current switch connected between said current input node of said second differential amplifier and said current source;
  wherein one of said inputs of said first differential amplifier is connected to said output of said counter; and
  wherein one of said inputs of said second differential amplifier is connected to said second input terminal.

5. The combination as claimed in claim 1 wherein said divide-by-N counter includes a plurality of emitter coupled stages, each stage including at least one current source which when turned on enables the stage and which when turned off disables the stage;
  wherein said current sources are coupled to said bias point of said counter; and
  wherein said control means coupled to said bias point applied a signal for selectively turning on and selectively turning off said current sources.

6. In a TV receiver, means for amplifying and multiplexing VHF and UHF signals comprising:
  amplifying means having first and second input ports, an output port and a control means which when set to a first condition enables the production at said output port of signals responsive only to the signals at said first input, and which when set to a second condition, enables the production at said output port of signals responsive only to the signals at said second input;
  a divide-by-N counter having an input, an output, and a bias input point for controlling its turn on and turn off, said counter producing at its output signals having a frequency of 1/N the frequency of the signal applied to its input;
  means for applying said UHF signals to said input of said counter;
  means for coupling said output of said counter to said first input port;
  means for applying said VHF signals to said second input port; and
  frequency selector means coupled to said bias input point and to said control means for selectively enabling said counter and setting said control means to said first condition and for selectively disabling said counter and setting said control means to said second condition.

7. Radio-signal receiver apparatus for receiving a plurality of frequency bands, having:
  first and second radio-frequency amplifiers respectively receptive of a first frequency band and of a second frequency band, the frequencies in said first band being substantially N times those in said second band;
  first and second voltage-controlled local oscillators for providing oscillations in said first band and in said second band respectively;
  first mixer means for mixing oscillations from said first local oscillator with the output signals of said first radio frequency amplifier;
  second mixer means for mixing oscillations from said second local oscillator with the output signals of said second radio-frequency amplifier;
  a reference oscillator supplying oscillations at a reference frequency;
  synthesizer means for comparing oscillations at said reference frequency with a selectable submultiple of the frequencies received at its input circuit to provide at its output circuit a low-frequency signal indicative of the departure in frequency of said selectable submultiple from said reference frequency; means for applying said low-frequency signal to said first and said second local oscillators to complete degenerative feedback loops for controlling their frequencies of oscillation; and
  pre-scaler means for dividing the frequencies of said first and second local oscillators by MN and M, respectively, where M and N are integers, for selective application to the input of said synthesizer means; wherein said pre-scaler means includes:
  a divide-by-M counter having an input circuit and having an output circuit connected to the input circuit of said synthesizer means;
  a divide-by-N counter having an input circuit connected to receive oscillations from said first local oscillator and having an output circuit;
  a first differential pair of transistors having an input circuit connected to the output circuit of said divide-by-N counter, having an output circuit connected to the input circuit of said divide-by-M counter, being responsive to the application of a first current to provide coupling between the output circuit of said divide-by-N counter and the input circuit of said divide-by-M counter, and being responsive to the non-application of said first current to interrupt said coupling between counters except for undesired coupling via feedthrough capacitance characteristics associated with said first differential pair of transistors;
  a second differential pair of transistors having an input circuit connected to receive oscillations from said second local oscillator, having an output circuit connected to the input circuit of said divide-by-M counter, being responsive to the application of a second current to provide coupling of oscillations from said second local oscillator to the input circuit of said divide-by-M counter, and being responsive to the non-application of said first current to interrupt coupling of oscillations from said first local oscillator to the input circuit of said divide-by-M counter except for undesired coupling via feedthrough capacitance characteristics associated with said second differential pair of transistors;
  control means for selectively applying either said first current to said first differential pair of transistors during a first control condition or said second current to said second differential pair of transistors during a second control condition; and
  means for suppressing said undesired couplings comprising:
  means for preventing the input circuit of said first differential pair of transistors from responding to the oscillations of said first local oscillator during said second control condition, and
  means for preventing the input circuit of said second differential pair of transistors from responding to the oscillations of said second local oscillator during said first control condition.

8. The radio-receiver as claimed in claim 7 wherein said means for preventing the input circuit of said first differential pair of transistors from responding to the oscillations of said first local oscillator includes:
  means for interrupting division by said divide-by-N counter during said second control condition.

* * * * *